United States Patent [19]
Wheeler et al.

[11] Patent Number: 5,341,036
[45] Date of Patent: Aug. 23, 1994

[54] TWO HAND OPERATED MACHINE CONTROL STATION USING CAPACITIVE PROXIMITY SWITCHES

[75] Inventors: Keith D. Wheeler; Stanley H. Edwards, Jr., both of Raleigh, N.C.

[73] Assignee: Square D Company, Palatine, Ill.

[21] Appl. No.: 805,422

[22] Filed: Dec. 11, 1991

[51] Int. Cl.⁵ .............................................. H01H 9/26
[52] U.S. Cl. .................... 307/328; 361/179;
    361/189; 340/573; 192/131 R; 192/129 A
[58] Field of Search ................... 307/116–118,
    307/308, 326, 328, 140, 141.4; 361/179–181,
    189, 280; 200/600, 61.85; 340/551, 552, 561,
    568, 573; 328/5, 7, 1; 192/129 R–132 R

[56] References Cited

U.S. PATENT DOCUMENTS

| | | | |
|---|---|---|---|
| 3,089,985 | 5/1963 | Camfield et al. | 361/189 |
| 3,560,800 | 2/1971 | Weidenfeld | 361/189 |
| 3,764,819 | 10/1973 | Muller | 307/116 |
| 3,895,269 | 7/1975 | Geremia | 361/189 |
| 4,031,408 | 6/1977 | Holz | 307/116 |
| 4,074,602 | 2/1978 | Brower | 361/189 X |
| 4,412,268 | 10/1983 | Dassow | 361/181 |
| 4,767,940 | 8/1988 | Tuttle | 307/116 |
| 5,168,173 | 12/1992 | Windsor | 307/139 |
| 5,212,621 | 5/1993 | Panter | 361/181 |

*Primary Examiner*—A. D. Pellinen
*Assistant Examiner*—Fritz M. Fleming
*Attorney, Agent, or Firm*—Larry I. Golden; D. Russell Stacey; Larry T. Shrout

[57] ABSTRACT

A machine operator control station circuit which uses capacitive proximity switches to replicate the function of mechanical switches used in prior art control stations. A monitoring circuit for monitoring the "on" state of the capacitive proximity switches used in a two hand industrial machine control station is disclosed. The circuit also reduces the chance of unintended operation of the machine being controlled as a result of emitted or conducted radio frequency interference which might be detected by the capacitive proximity switches. An isolation transformer provides an isolated power supply for the monitoring circuit. The monitoring circuit includes a first capacitive proximity switch for detecting the presence of one of the machine operator's hands, and a second capacitive proximity switch for detecting the presence of the other of the machine operator's hands. Each proximity switch has a monitoring circuit for monitoring the length of time the proximity switch remains in the activated or "on" state. The monitoring circuits of the first and second proximity switches are connected together such that both switches must be activated within a set time window in order to activate the machine control circuit.

10 Claims, 6 Drawing Sheets

TWO HAND OPERATED MACHINE CONTROL STATION USING CAPACITIVE PROXIMITY SWITCHES

FIELD OF THE INVENTION

The present invention relates to industrial machine controls which require two hand operation to meet O.S.H.A. standards, and particularly to industrial machine controls using capacitive proximity switches as a means for the machine operator to activate the machine.

BACKGROUND OF THE INVENTION

O.S.H.A. requirements for many industrial machine controls specify that the operator must use both hands to initiate operation of the machine. This requirement was established to prevent possible hand injuries to the machine operator. Most machine control stations of this type employ two palm button mechanical switches. The two palm buttons must close the operating circuit to cause the machine to operate. The force required to press the palm buttons is variable with each palm button, however, it is sufficient enough to give the operator a "tactile feel" indicating to him that the switch has been activated. U.S. Pat. No. 4,412,268 to Dessow discloses an industrial machine control station employing two proximity switches which replicate the function of the more conventional palm button mechanical switches for controlling an industrial machine. In Dassow's device the machine operator is required to touch a sensing plate to operate the machine. The control circuit of Dessow does not provide for proximity switch failure monitoring. It is also noted that the machine control station disclosed in the patent to Dassow has output contacts which are connected in series with the line power to the machine being controlled. As a result, the high current carried by the output contacts significantly increases the chance of welding such contacts closed which could result in the machine being controlled continuing to run after the operator has removed his hands from the operator station. Dassow's output circuit is also controlled by an anti-cheat timer which would appear to provide a pulsed output to the machine. A pulsed output would require adjustment to match the machine's operating time cycle. The patent to Dassow also discloses the provision of proximity switches which are tuned to different frequencies for the purpose of preventing "inadvertent operation as a consequence of operating the first switch", i.e. unintended activation of one of the two proximity switches caused by interference from the other switch. However, the patent to Dassow does not address or even recognize the problem of unintended simultaneous activation of both capacitive proximity switches which is caused by the presence of emitted or conducted radio frequency interference.

SUMMARY OF THE INVENTION

A first object of the present invention is to provide a more ergonomic operator station by eliminating the physical contact pressure required to activate prior art machine controls of the type using two palm button switches. This is achieved by incorporating two capacitive proximity switches, spaced apart one from the other at a distance comfortable for the machine operator, and mounted in a machine control station. The capacitive proximity switches do not require physical contact by the machine operator to be activated or turned "on". To activate the capacitive proximity switch the machine operator places his hand in the sensing field of the switch. Therefore, the machine operator is not subjected to the repetitive pressing of palm button switches required with prior art devices.

Since there is no physical pressure required to activate a capacitive proximity switch, the machine operator will have no tactile feedback to indicate that the switch has been activated. Accordingly, a second object of the present invention is to provide an indicator light source in the capacitive proximity switch circuit for providing the machine operator with a visual indication that the capacitive proximity switch has been activated. In the preferred embodiment of the present invention, this indicator light is placed at a point in the machine control station that is easily visible to the machine operator.

A third object of the present invention is to provide a capacitive proximity switch monitoring circuit which will prevent the machine control station of the present invention from operating the machine to which it is connected if either capacitive proximity switch should fail in the "on" state, or have an object placed in its sensing field for an extended period of time. In the preferred embodiment of the present invention, a monitoring circuit is provided for each of the two capacitive proximity switches. Each monitoring circuit includes an interval timer relay which monitors the length of time the capacitive proximity switch is in the "on" state. The interval timer relay has a normally open contact which controls an output control relay. The output control relay provides normally open and normally closed contacts to the input circuit of the machine control. If the capacitive proximity switch is "on" for a period of time longer than the interval timer relay is programmed for, its normally open contact will open. This in turn will deenergize the output control relay causing its normally open contact to open and thereby open the output circuit of the machine control station. The normally open contact of the interval timer relay will remain open until the interval timer relay has been reset. The interval timer relay can only be reset when the capacitive proximity switch is returned to the "off" state or a failed "on" switch has been replaced with a new capacitive proximity switch. Therefore, if someone places an object in the proximity sensing field or the capacitive proximity switch should fail in the "on" state the interval timer relay normally open contacts will open causing the output control relay to deenergize and therefore open the machine control output circuit prohibiting machine operation.

Each of the sensor monitoring circuits are electrically coupled together such that the machine operator must activate both capacitive proximity switches within a specific time window in order to initiate the machine operation. This time window is determined by the first interval timer relay to be activated. If both capacitive proximity switches are not activated within this time window they must both be returned to the "off" state to reset their respective interval timer relays. If both interval timer relays are not reset the machine control output circuit cannot be activated.

A fourth object of the machine control station of the present invention is to provide an isolated output from the machine control station to the machine such that any voltage required to operate the machine may be controlled by the operator at the machine control station. This is accomplished by providing isolated normally closed and normally open output terminals associated with each capacitive proximity switch for the control power to the machine being operated. The isolated outputs also permit this machine control circuit to be retrofitted to machines having O.S.H.A. approved anti-tie down and anti-repeat circuits.

A fifth object of the machine control station of the present invention is to provide a continuous, non-pulsed output to the machine being controlled. This is accomplished by using a timer bypass relay to control the isolated output contacts. The timer bypass relay is energized only when both capacitive proximity switches are activated within the time window. The timer bypass relay will remain energized as long as both capacitive proximity switches remain activated.

A sixth object of the present invention is to provide a machine control station employing capacitive proximity switches which has an increased immunity to interference from most conducted or emitted radio frequencies. It has been determined that a capacitive proximity sensor can be activated by conducted or emitted radio frequencies that are at or near the internal oscillator frequency of the sensor. Certain types and shapes of enclosure enhance the detecting capabilities of capacitive sensors and thereby increase the probability of inadvertent activation by radiated radio frequency interference. In the machine control station of the present invention, the possibility of radiated radio frequency interference activating both sensors simultaneously is minimized by providing for the two capacitive proximity switches having internal operating frequencies which are sufficiently separated as discussed in greater detail in the detailed description of the preferred embodiment hereinbelow. Capacitive proximity switches may also be inadvertently activated by conducted radio frequency interference. The possibility of simultaneous activation of the two capacitive proximity switches by conducted radio frequency interference is minimized in the present invention by the provision of an isolation transformer placed in its power input circuit. In either case the status of the capacitive proximity switch is displayed to the operator by the indicator lights provided by the present invention.

Other features and advantages of the invention will become apparent to those skilled in the art upon review of the following detailed description, claims and drawings.

Figure 1:
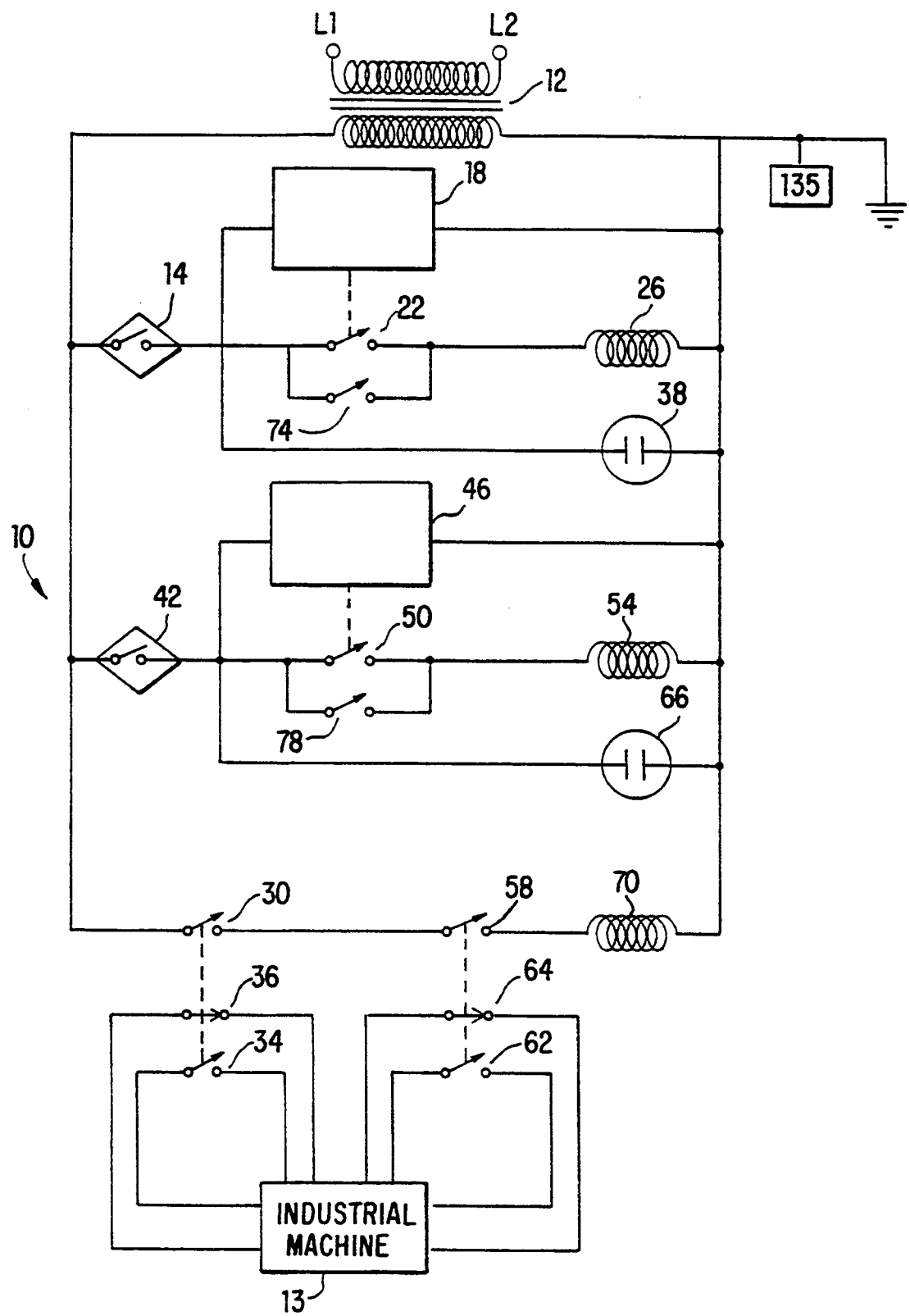
FIG. 1 is a schematic of an AC capacitive proximity switch monitoring and indicator light circuit for a machine operator control station constructed in accordance with the present invention.

Before one embodiment of the invention is explained in detail, it is to be understood that the invention is not limited in its application to the details of construction and description or illustrated in the drawings. The invention is capable of other embodiments and of being practiced or being carried out in various other ways. Also, it is to be understood that the phraseology and terminology used herein is for the purpose of description and should not be regarded as limiting.

DESCRIPTION OF THE PREFERRED EMBODIMENT

An AC electrical circuit 10 for a two hand industrial machine operator control station having capacitive proximity switches which replicate the function of palm button mechanical switches used in prior art control stations is shown in FIG. 1. The circuit 10 is designed to prevent an industrial machine 13 from operating if either of the two capacitive proximity switches 14, 42 should fail in the "on" state, or if an object is placed in the sensing field of either capacitive proximity switch for an extended period of time. The circuit 10 is also designed to reduce the chance of inadvertent simultaneous activation of the capacitive proximity switches 14 and 42 by an emitted or conducted radio frequency.

Referring to FIG. 1, the circuit 10 includes an isolation transformer 12 having terminals L1 and L2 for connecting to an external AC power source and a primary 12' and secondary 12". The isolation transformer 12, through the secondary 12", provides an isolated AC power supply to the circuit 10, a first AC 2-wire capacitive proximity switch 14 which can be activated (closed or placed in the "on" state) by the presence of one of the machine operator's hands within its sensing field, a capacitive proximity switch monitor comprising a first interval timer relay 18 having a normally open electrical contact 22, a first output control relay 26 having a first normally open electrical contact 30, a second normally open electrical contact 34 and a normally closed electrical contact 36, a first indicator light source 38, a second AC 2-wire capacitive proximity switch 42 which can be activated by the presence of the machine operator's other hand within its sensing field, a second interval timer relay 46 having a normally open electrical contact 50, a second output control relay 54 having a first normally open electrical contact 58, a second normally open electrical contact 62 and a normally closed electrical contact 64, a second indicator light source 66, and a timer bypass relay 70 having a first normally open electrical contact 74 and a second normally open electrical contact 78.

Still referring to FIG. 1, the first capacitive proximity switch 14 is connected in series with the first interval timer relay 18 such that the relay 18 is energized when the first capacitive proximity switch 14 is activated or turned "on" by the presence of one of the machine operator's hands. The first interval timer relay 18 monitors the length of time the first capacitive proximity switch 14 is activated, or in the "on" state. When the first interval timer relay 18 is energized, its normally open contact 22, which is connected in series with and between the first capacitive proximity switch 14 and the first output control relay 26, is closed and remains closed for a preselected interval of time; however, contact 22 will immediately open if relay 18 becomes deenergized. Closing contact 22 energizes the first output control relay 26 which causes its first and second normally open contacts 30 and 34, respectively, to close and its normally closed contact 36 to open. The first indicator light source 38, a neon light in the preferred embodiment, is connected in series across the line with the capacitive proximity switch 14 and is energized when the first capacitive proximity switch 14 is activated and remains illuminated as long as the first capacitive proximity switch 14 is in the "on" state.

Still referring to FIG. 1, the second capacitive proximity switch 42 is connected in series with the second interval timer relay 46 such that the second interval timer relay 46 is activated when the second capacitive proximity switch 42 is activated or turned "on" by the presence of the other of the machine operator's hands within its sensing field. The second interval timer relay 46 monitors the length of time the second capacitive proximity switch 42 is activated, or in the "on" state. When the second interval timer relay 46 is activated its normally open electrical contact 50, which is connected in series with and between the second capacitive proximity switch 42 and the second output control relay 54, is closed and remains closed for a preselected interval of time; however, contact 50 will immediately open if relay 46 becomes deenergized. Closing contact 50 energizes the second output control relay 54, causing its first and second normally open contacts 58 and 62, respectively, to close and its normally closed contact 64 to open. The second indicator light source 66, a neon light, is also energized when the second capacitive proximity switch 42 is activated and remains illuminated as long as the second capacitive proximity switch 42 is in the "on" state.

The first normally open contact 30 of the first output control relay 26 and the first normally open contact 58 of the second output control relay 54 are connected in series with the timer bypass relay 70. The first normally open contact 74 of the timer bypass relay 70 is connected in parallel with the normally open contact 22 of the first interval timer relay 18 and the second normally open contact 78 of the timer bypass relay 70 is connected in parallel with the normally open contact 50 of the second interval timer relay 46.

The second normally open contacts 34 and 62 of first and second output control relays 26 and 54 respectively are the isolated output terminals for connecting the machine control station to the circuitry of the industrial machine 13 to be operated. The normally closed contacts 36 and 64 of first and second output control relays 26 and 54, respectively, are isolated outputs for connecting to an O.S.H.A. approved anti-tie down circuit.

It will be apparent to those skilled in the art that if a machine operator activates both capacitive proximity switches 14 and 42 within the preselected time interval determined by the first interval timer relay, 18 or 46, to be activated, the first and second output control relays 26 and 54 respectively will be energized, closing the first normally open contacts 30 and 58 of the first and second output control relays 26 and 54, respectively, thereby energizing timer bypass relay 70. Energizing the timer bypass relay 70 closes its first and second normally open contacts 74 and 78, respectively, thereby keeping the first and second output control relays 26 and 54, respectively, energized when the contacts 22 and 50 open after the expiration of the time intervals determined by the relays 18 and 46, respectively. Thereafter, as long as both first and second capacitive proximity switches 14 and 42, respectively, are simultaneously held in the "on" state, the second normally open contacts 34 and 62 of first and second output control relays 26 and 54 respectively will be closed and the normally closed contacts 36 and 64 of first and second output control relays 26 and 54 respectively will be open permitting a non-pulsed control signal to be sent to the industrial machine 13.

It will also be apparent to those skilled in the art that if the machine operator does not activate both capacitive proximity switches 14 and 42 within the time window defined by the first interval timer relay to be activated, the first interval timer to be energized will cause its associated normally open contact 22 or 50 to open thereby deenergizing the associated first or second output control relay 26 or 54 respectively. This will in turn cause the first and second normally open contacts and the normally closed contact associated with the deenergized output control relay 26 or 54 to return to their normal state, thereby preventing the industrial machine from operating.

The interval timer relays 18 and 46 can only be reset by deactivating or turning off their respective capacitive proximity switches 14 and 42. It will be apparent to those skilled in the art that if either of the interval timer relays 18 or 46 is not reset after the relay 70 has been deenergized, the associated output control relay 26 or 54, respectively, will remain deenergized while their respective associated normally open isolated output contacts 34 or 62 will not close nor will their respective normally closed contacts 36 or 64 open, thus the machine 12 is prevented from operating.

It will be noted that in the preferred embodiment the preselected time intervals during which contacts 22 and 50 remain closed after the interval timer relays 18 and 46, respectively, are energized are determined by the selection and adjustment of the timer relays 18 and 46 and for most applications the intervals will be set to be the same for both relays.

Figure 2:
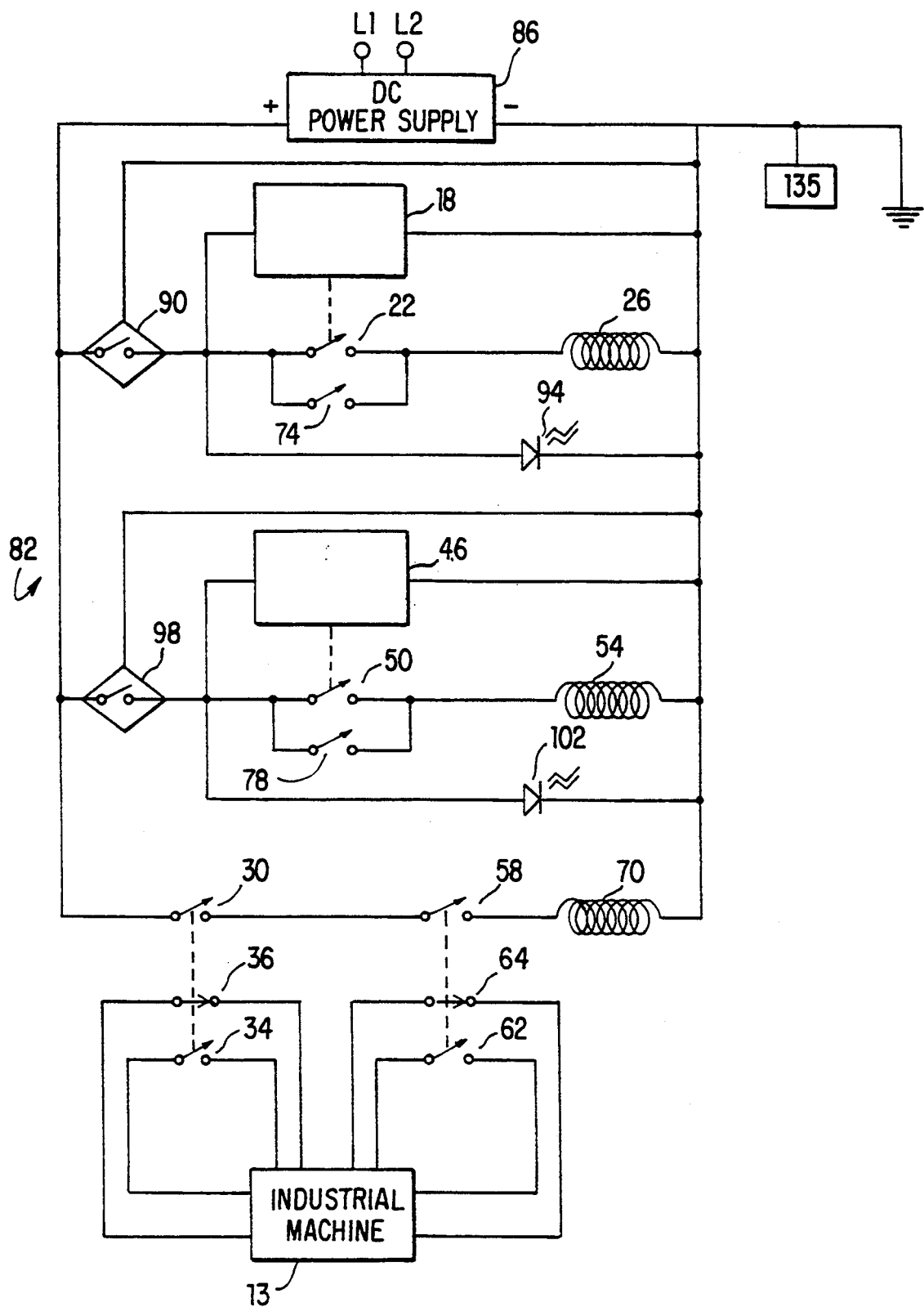
FIG. 2 is a schematic of a second embodiment of the capacitive proximity switch monitoring circuit of a machine operator control station constructed in accordance with the present invention for use with DC circuits.

An alternate embodiment of the present invention for use in DC circuits is shown in FIG. 2. The circuit 82 works in the essentially same manner as the AC monitoring circuit 10 of FIG. 1 and uses the many of the same components described in the first embodiment with the following exceptions. A DC power supply 86 provides DC power for the monitoring circuit 82. The first AC 2-wire capacitive proximity switch 14 of the previously described embodiment is replaced with a first DC 3-wire capacitive proximity switch 90. The first indicator light source 38 of the previously described embodiment is replaced with a first indicator light source 94, and in this embodiment is preferably a light emitting diode (LED). The second AC 2-wire capacitive proximity switch 42 of the previously described embodiment is replaced with a second DC 3-wire capacitive proximity switch 98. The second indicator light source 66 of the previously described embodiment is replaced with a second indicator light source 102, an LED.

Figure 4:
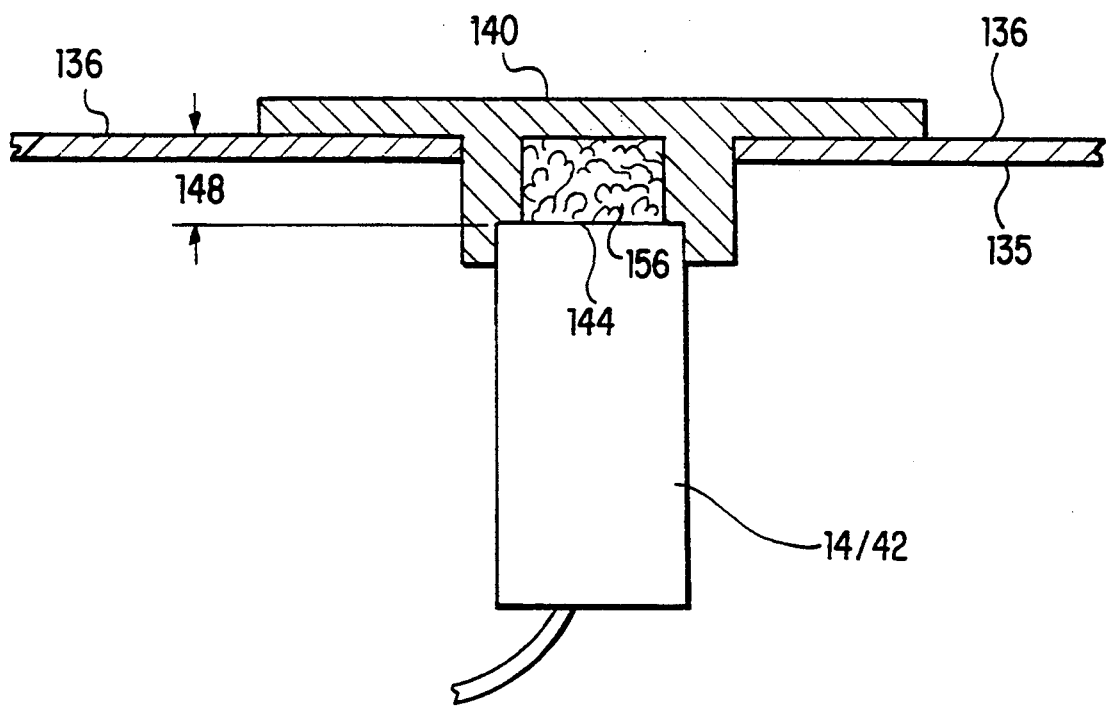
FIG. 4 is a cross-sectional view of a portion of a machine operator control station constructed in accordance with the present invention which is illustrative of the relative positioning of the enclosure and sensing pad embodied by the control station.

It has been empirically determined that capacitive proximity sensors must be enclosed in a metallic housing 135, partially shown in FIG. 4, to prevent activation by radio frequency fields above 27 Mhz. It has further been empirically determined that capacitive proximity switches are subject to activation, i.e. being turned on, by emitted radio frequencies having field strengths above a threshold level if the metallic enclosure in which the proximity switches are installed is ungrounded. It will be noted that the one side of the output of the isolation transformer 12 is electrically connected to the metallic housing 135, partially illustrated in FIG. 4, which is grounded in the preferred embodiment, as shown in FIG. 1. It will be understood that because the proximity switches and the enclosure 135 are at the same potential, the enclosure 135 will act as a shield to radio frequency interference with the proximity switches 14 and 42, so long as the enclosure is grounded. However, if the enclosure is ungrounded it will act as an antenna and an electrical potential can be induced in the enclosure 135 in the presence of a radio frequency field. Because it is anticipated that a user of an operator station constructed in accordance with the present invention might fail to provide a ground for the enclosure or the connection to ground might unknowingly become broken, means are provided, as described in greater detail hereinbelow, for preventing simultaneous activation of the proximity switches 14 and 42 in the presence of radio frequency fields which could be expected to be present. It will be appreciated by those skilled in the art that fields in the frequency range of concern could be produced by a radio transmitter in the AM band located near the operating station of the present invention. In addition, it is anticipated that the present invention will be used in industrial environments where devices such as adjustable frequency drives will be operating which could produce fields in the frequency range of concern.

Figure 3:
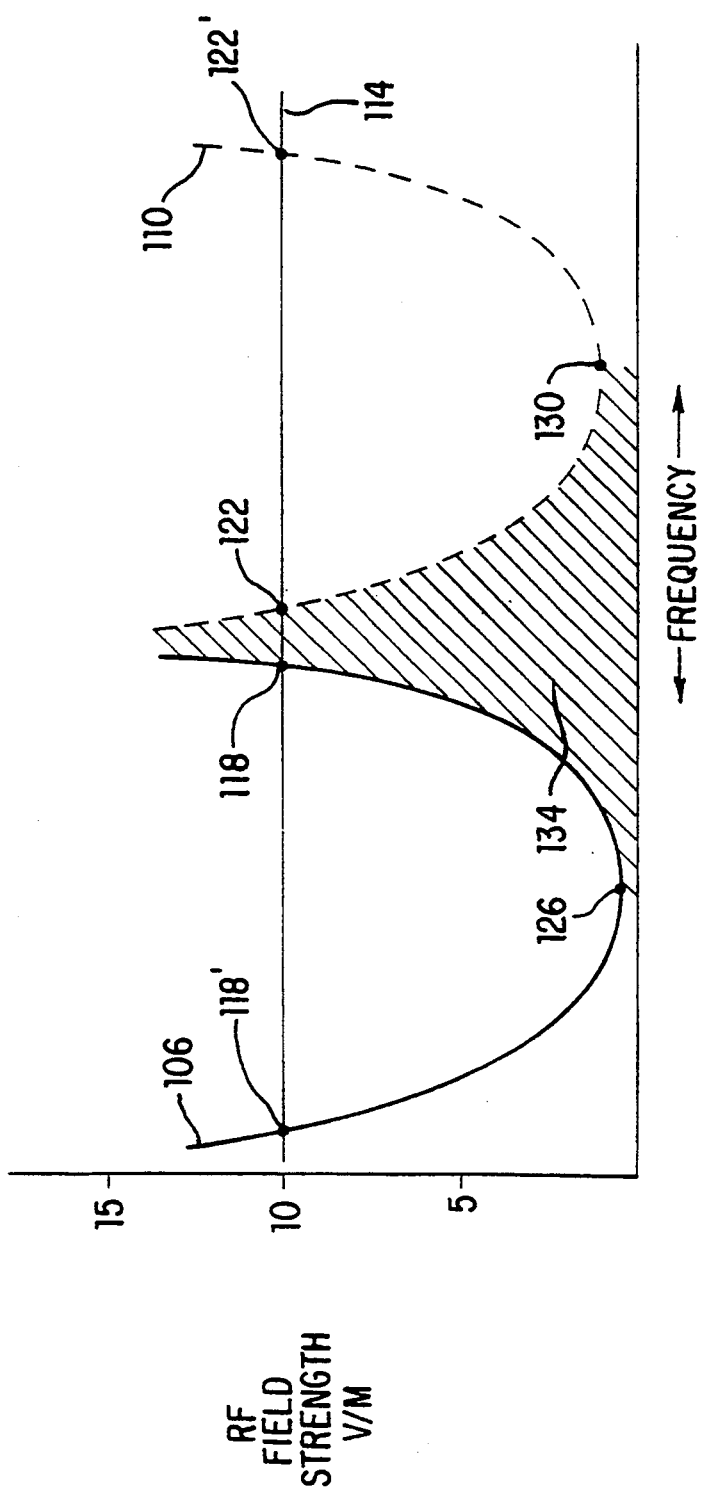
FIG. 3 is a graph of the relationship of the frequency sensitivity curves of the two capacitive proximity switches utilized by the present invention with respect to a radio frequency field strength expressed in volts per meter.

FIG. 3 is a graph comparing the frequency sensitivity curve 106 of the first capacitive proximity switch 14 and the frequency sensitivity curve 110 of the second capacitive proximity switch 42 to an emitted radio frequency having the field strengths plotted in the graph. The horizontal axis of the graph is a function of frequency and the vertical axis of the graph expresses the field strength of the emitted radio frequency in volts per meter. The horizontal line 114 indicates an emitted radio frequency having a field strength equivalent to 10 volts/meter. It will be appreciated by those skilled in the art that the area above and including the curves 106 and 110 represent the conditions under which the capacitive proximity switches 14 and 42, respectively, are subject to activation in the presence of an emitted radio frequency. The two points 118 and 118' on the frequency sensitivity curve 106 indicate the intersection of the frequency curve 106 of the first capacitive proximity switch 14 with the 10 volts/meter field strength line 114. The two points 122 and 122' on the frequency sensitivity curve 110 indicate the intersection of the frequency sensitivity curve 110 of the second capacitive proximity switch 42 with the 10 volts/meter field strength line 114. The points 126 and 130 on the frequency sensitivity curves 106 and 110, respectively, indicate the point of maximum sensitivity of the first and second capacitive proximity switches 14 and 42, respectively, to an emitted radio frequency. It has been determined that the points 126 and 130 correspond approximately, if not identically, with the internal operating frequencies of the capacitive proximity sensors 14 and 42, respectively. The frequency sensitivity curves of a given model proximity switch can be empirically determined. Accordingly, in the preferred embodiment of the present invention, the first and second capacitive proximity switches 14 and 42 are selected such that the sensitivity curves 106 and 110 of the first and second capacitive proximity switches 14 and 42, respectively, do not overlap any point below the 10 volt/meter strength line 114 and in an embodiment constructed in accordance with applicants' best mode are spaced apart by approximately 75 Kilohertz at points 118 and 122 where sensitivity curves 106 and 110, respectively, intersect the 10 volts/meter field strength line 114. It will be appreciated by those skilled in the art that, as the sensitivity of the first capacitive proximity switch 14 increases from point 118 to point 126 on curve 106 and the sensitivity of the second capacitive proximity switch 42 increases from point 122 to point 130 on curve 110, the required bandwidth, i.e. the horizontal distance (measured in terms of frequency) between the curves 106 and 110, indicated by diagonal lines 134, of an emitted radio frequency which could cause unintended and simultaneous activation of both the first and second capacitive proximity switches 14 and 42, respectively, also increases. It has been empirically determined that capacitive proximity sensors having the characteristics illustrated by the graphs in FIG. 3 are an Efector Model KB-2020-ABOW proximity switch having an internal frequency of approximately 300 Khz, available from Efector, Inc., Exton, Pa., and a Square D Class 9006 Catalog No. DPJA21 proximity switch having an internal operating frequency of approximately 1400 Khz, available from authorized distributors of the Square D Company, Palatine, Ill.

Referring to FIG. 3, the method of selecting the capacitive proximity switches 14 and 42 will include the steps of selecting a first proximity switch 14 having a frequency sensitivity curve 106 in which the bandwidth 118/118' at a preselected field strength, 10 Volts/Meter in the preferred embodiment, is relatively (i.e. considering such factors as costs and availability) narrow, and selecting a second proximity switch 42 having a different (greater in the example illustrated in FIG. 3) internal operating frequency than the first switch 14, and having a frequency sensitivity curve 110 in which the bandwidth 122/122' at a preselected field strength, 10 Volts/Meter in the preferred embodiment, is also relatively narrow, such that the sensitivity ranges, i.e. the points above and including the curves 106 and 110, do not intersect below a preselected field strength, 10 Volts/Meter in the preferred embodiment, and the bandwidth 118/122 at a preselected field strength, 10 Volts/Meter in the preferred embodiment, between the sensitivity curves 106 and 110 below their point of intersection is at least a threshold level. It will be appreciated by those skilled in the art that the threshold field strengths and bandwidth (i.e. frequency difference) of 118 and 122 are a function of the environment in which the operator station of the present invention is expected to be safely utilized. It has been determined that a bandwidth 118/122 of approximately 75 Khz at field strengths of 10 Volts/Meter in conjunction with the interval timer relays 18 and 46 (shown in FIG. 1) being set for a preselected threshold interval of 0.5 seconds will provide a high degree of safety, i.e. minimal probability of simultaneous activation of the capacitive proximity switches 14 and 42 by radio frequency interference, in most industrial environments.

Figure 5:
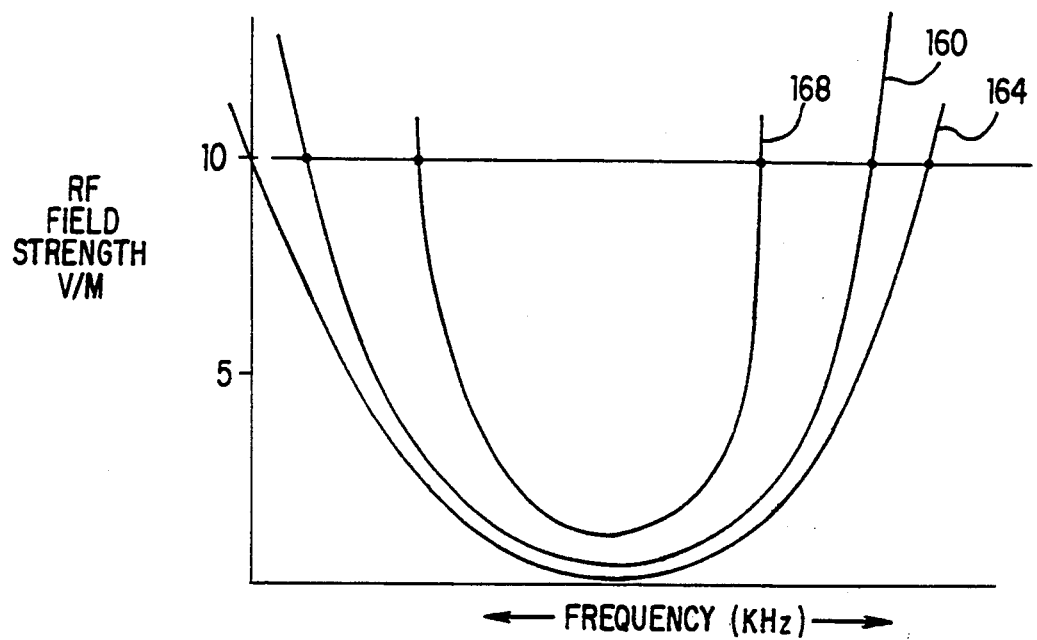
FIG. 5 is a graph of the relationship of the frequency sensitivity with respect to the field strength, expressed in volts per meter, of a capacitive proximity switch having its sensing plate positioned in approximately the same plane as the surface of the enclosure of a machine operator control station constructed in accordance with the present invention as compared to having the sensing plate positioned above (outboard) the surface of the enclosure or below (inboard) the surface of the enclosure as it is positioned in the preferred embodiment of the surface of the enclosure or below (inboard) the surface of the present invention.

FIG. 4 is a cross-sectional view of a portion of the operator station enclosure 135 having an outside surface 136/136' sensing pad 140/140', and one of the capacitive proximity switches 14 or 42 as positioned in the present invention. Each of the capacitive proximity switches 14 and 42 includes a sensing plate 144 which forms the detecting surface of the switch. It has been empirically determined that the placement of the sensing plate 144 with respect to the surface 136 of the enclosure 135 will affect the radio frequency sensitivity of the switch 14 or 42. If the sensing plate 144 is placed in approximately the same plane as the surface 136, the sensitivity would be represented by the curve 160 in FIG. 5. If the sensing plate 144 is placed in a plane above (i.e. outboard of) the surface 136 of the enclosure 135, the frequency sensitivity of the capacitive proximity switch would be represented by the curve 164 in FIG. 5. It will be appreciated by those skilled in the art that placement of the sensing plate 144 above the surface 136 of the enclosure 135 increases the probability of an emitted radio frequency activating both capacitive proximity switches 14 and 42 simultaneously. If the sensing plate 144 is placed in a plane below (i.e. inboard of) the surface 136 of the enclosure 135, the sensitivity curve would be represented by the curve 168 in FIG. 5. Placement of the sensing plate 144 below the surface 136 of the enclosure 135 therefore decreases the probability of an emitted radio frequency activating both capacitive proximity switches simultaneously. Therefore, the distance 148 between the surface 136 of the enclosure 135 and the sensing plate 144 is approximately ¼ inch in the preferred embodiment in order to decrease the susceptibility of two capacitive proximity switches 14 and 42 to activation by radio frequency fields.

Figure 6:
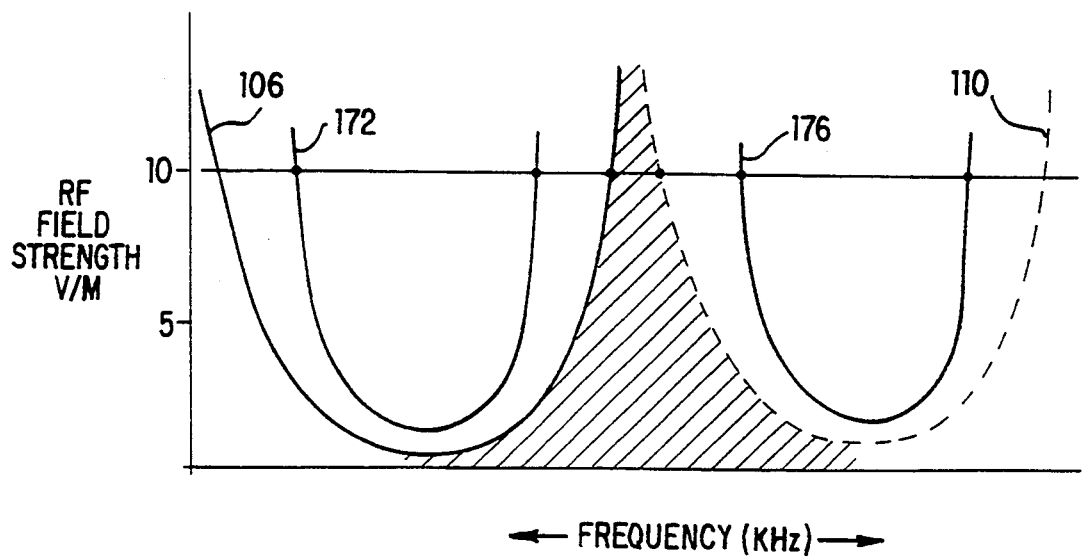
FIG. 6 is a graph of the relationship of the frequency sensitivity with respect to the field strength, expressed in volts per meter, of the two capacitive proximity switches having their sensing plates positioned below (inboard of) the plane of the surface of the enclosure, as they are positioned in the preferred embodiment of a machine operator control station constructed in accordance with the present invention, as compared to having their sensing plates positioned in approximately the same plane as the surface of the enclosure.

FIG. 6 is a graph comparing the frequency sensitivity curves 106 and 110 of the first and second capacitive proximity switches 14 and 42, respectively, having the sensing plates 144 in the same plane with the enclosure surface 136 with the sensitivity curves 172 and 176 of the first and second capacitive proximity switches 14 and 42, respectively, when the sensing plates 144 are in a plane below the enclosure surface 136. It can be seen in FIG. 6 that placing the sensing plates 144 below the enclosure surface 136 increases the frequency separation between the sensitivity curves of the two capacitive proximity switches 14 and 42.

It will be appreciated by those skilled in the art that the isolation transformer 12, shown in FIG. 1, will prevent interference with the capacitive proximity switches 14 and 42 by radio frequency signals conducted by power lines on the line side of the transformer 12, as the isolation transformer 12 will effective block any signals in the frequency range of concern.

Referring to FIG. 4, the effective sensing distance above the sensing pad 140 will vary depending on the content of the space or volume 156 between the sensing pad 140 and the sensing plate 144. If the volume 156 is solid, the sensing distance 152 will be increased; if the volume 156 is hollow (e.g. air), the sensing distance will be decreased. In the preferred embodiment, the volume 156 is substantially hollow in order to effectively limit the sensing distance, thereby reducing the probability of unintended activation of the proximity switch.

Figure 7:
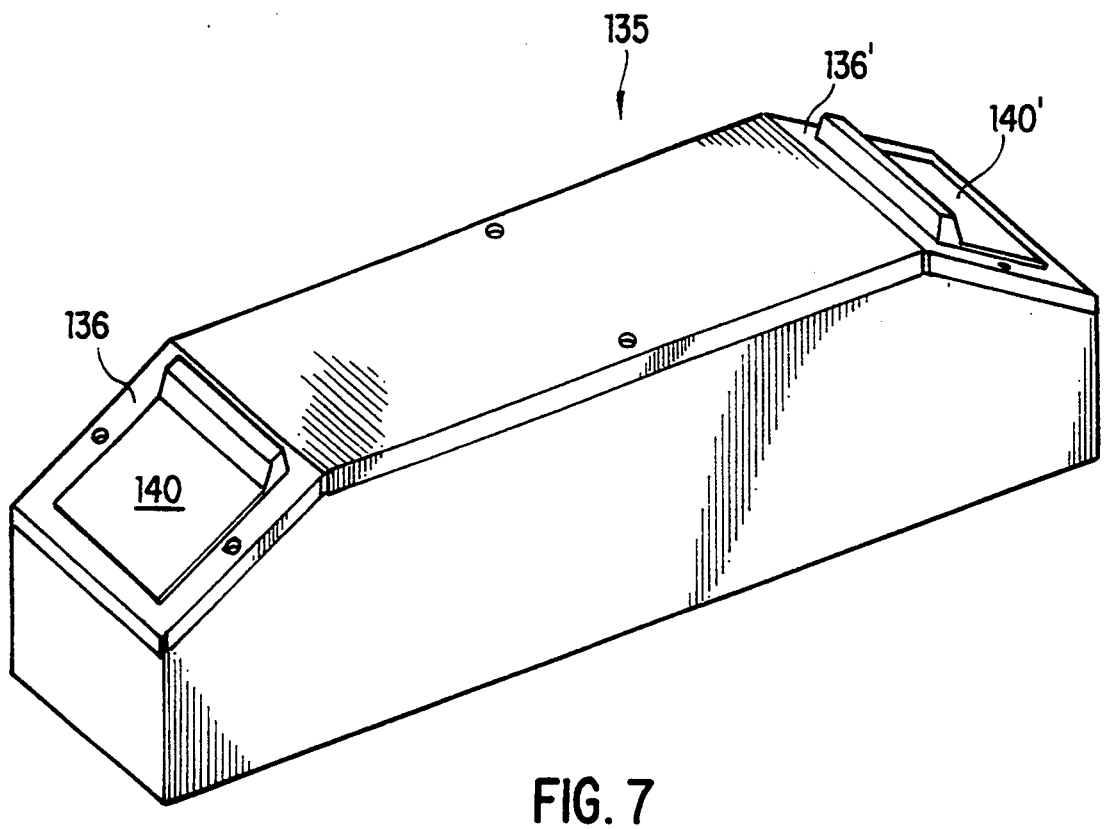
FIG. 7 is an isometric view of an enclosure for a machine operator control station constructed in accordance with the present invention.

FIG. 7 is an isometric view which illustrates a preferred embodiment of the enclosure 135 of the machine operator control station of the present invention including the outside surfaces 136 and 136' and the sensing pads 140 and 140' The preferred orientation of the capacitive proximity switches 14 and 42 within the enclosure 135 is illustrated in FIG. 4 and described above.

We claim:

1. A machine control station comprising:
   an isolation transformer for providing an isolated power supply to said machine control station, the primary of said isolation transformer being electrically connectable to a source of AC electric power;
   an enclosure;
   a first capacitive proximity switch received within said enclosure and electrically coupled to the secondary of said isolation transformer;
   a second capacitive proximity switch received within said enclosure and electrically coupled to the secondary of said isolation transformer;
   a first interval timer relay electrically coupled to said first capacitive proximity switch and the secondary of said isolation transformer whereby said first interval timer relay is energized upon activation/turning "on" of the first capacitive proximity switch, the first interval timer relay having a set of normally open contacts connected in series with the first capacitive proximity switch and which close for a preselected interval of time upon energization of the first interval timer relay and then open and remain open until the first interval timer relay is reset by the deactivation/turning "off" of the first capacitive proximity switch;
   a first output control relay electrically coupled to said normally open contacts of said first interval timer relay and the secondary of said isolation transformer whereby said first output control relay is energized when last said contacts are closed, said first output control relay having a first set of normally open contacts coupled to the secondary of said isolation transformer and a second set of normally open contacts;
   a second interval timer relay electrically coupled to the second capacitive proximity switch and the secondary of said isolation transformer whereby the second interval time relay is energized upon the activation/turning "on" of the second capacitive proximity switch, the second interval timer relay having a set of normally open contacts connected in series with the second capacitive proximity switch and which close for a preselected interval of time upon energization of the second interval timer relay and then open and remain open until the second interval timer relay is reset by the deactivation/turning "off" of the second capacitive proximity switch;

a second output control relay electrically coupled to the normally open contacts of the second interval timer relay and the secondary of said isolation transformer whereby said second output control relay is energized when last said contacts are closed, the second output control relay having a first set of normally open contacts coupled to the secondary of said isolation transformer and a second set of normally open contacts;

a timer bypass relay electrically coupled to the secondary of said isolation transformer and having first and second sets of normally open contacts electrically connected in parallel with the normally open contacts of said first and second output relays, respectively, such that said first and second output relays will remain energized so long as said first and second capacitive proximity switches, respectively, are activated and said timer bypass relay is energized, said timer bypass relay being connected in series with the first sets of contacts of the first and second output control relays such that the timer bypass relay is energized when both the first and second output control relays are energized;

said second sets of normally open contacts of said first and second output control relays being electrically connectable to the control circuit of an electrically powered industrial machine such that both of last said sets of contacts must be closed for said machine to operate; and means for substantially preventing the unintended simultaneous closing of said second sets of normally open contacts of said first and second output control relays caused by an external radio frequency interference with said first and second capacitive proximity switches.

2. The machine control station of claim 1 further comprising first and second means for indicating the "on" or "off" state of said first and second capacitive proximity switches, respectively.

3. The machine control station of claim 1 wherein said means for substantially preventing the unintended simultaneous closing of said second sets of normally open contacts of said first and second output control relays caused by radio frequency interference with said first and second capacitive proximity switches comprises said enclosure being metallic.

4. The machine control station of claim 3 wherein said means for substantially preventing the unintended simultaneous closing of said second sets of normally open contacts of said first and second output control relays caused by radio frequency interference with said first and second capacitive proximity switches further comprises said enclosure being electrically connected to earth and said secondary of said isolation transformer such that said enclosure potential is allowed float with said first and second proximity switches should said earth connection become broken or disconnected.

5. The machine control station of claim 1 wherein said means for substantially preventing the unintended simultaneous closing of said second sets of normally open contacts of said first and second output control relays caused by radio frequency interference with said first and second capacitive proximity switches comprises said first and second capacitive switches having different radio frequency sensitivity characteristics, said characteristics falling within a preselected range.

6. The machine control station of claim 5 wherein said means for substantially preventing the unintended simultaneous closing of said second sets of normally open contacts of said first and second output control relays caused by radio frequency interference with said first and second capacitive proximity switches comprises said preselected intervals of time, determined by said first and second interval timer relays, are less than a preselected threshold interval of time.

7. The machine control station of claim 6 wherein said threshold interval of time is 0.5 seconds.

8. The machine control station of claim 4 wherein said means for substantially preventing the unintended simultaneous closing of said second sets of normally open contacts of said first and second output control relays caused by radio frequency interference with said first and second capacitive proximity switches further comprises one terminal of the secondary of said isolation transformer being electrically connected to said enclosure.

9. The machine control station of claim 1 wherein said means for substantially preventing the unintended simultaneous closing of said second sets of normally open contacts of said first and second output control relays caused by radio frequency interference with said first and second capacitive proximity switches comprises said preselected intervals of time, determined by said first and second interval timer relays, are less than a preselected threshold interval of time.

10. The machine control station of claim 9 wherein said threshold interval of time is 0.5 seconds.

* * * * *